(12) United States Patent
Ghis

(10) Patent No.: US 6,246,044 B1
(45) Date of Patent: Jun. 12, 2001

(54) SWITCHED ELECTRICAL PULSE PROPAGATION SAMPLER

(75) Inventor: Anne Ghis, Saint Martin d'Heres (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/085,716

(22) Filed: May 28, 1998

(30) Foreign Application Priority Data

May 28, 1997 (FR) .................................................. 97 06534

(51) Int. Cl.[7] .................................................... H01J 40/14
(52) U.S. Cl. .............................. 250/214 LS; 250/214 LA
(58) Field of Search ..................... 250/227.21, 227.22, 250/208.1, 216, 214 LS, 214 LA; 327/514, 515; 356/221–226

(56) References Cited

U.S. PATENT DOCUMENTS

| 3,946,247 | | 3/1976 | Collins et al. . |
| 4,499,384 | * | 2/1985 | Segawa et al. ...................... 250/578 |
| 4,866,441 | | 9/1989 | Conway et al. . |
| 5,471,162 | | 11/1995 | Mc Ewan . |
| 5,519,342 | | 5/1996 | Mc Ewan . |
| 5,663,555 | * | 9/1997 | Miyawaki et al. ................. 250/208.1 |
| 5,721,422 | * | 2/1998 | Bird ................................... 250/208.1 |

FOREIGN PATENT DOCUMENTS 2249646   5/1992   (GB) .

* cited by examiner

Primary Examiner—Que T. Le
(74) Attorney, Agent, or Firm—Burns Doane Swecker & Mathis LLP

(57) ABSTRACT

A sampler adapted for the measurement of ultra-short electrical pulses of a very broad spectrum. The sampler has an electrical pulse propagation structure (i.e., propagation line) made up of a series of line sections. The line sections are linked to one another by switches which can be commanded electrically. Normally, the switches are on or closed. The taking of samples can occur by opening the switches to thereby confine the totality of the charges carried by the pulse to the different sections that make up the propagation line. Once the switches are opened, the charge may be sampled in each section.

19 Claims, 3 Drawing Sheets

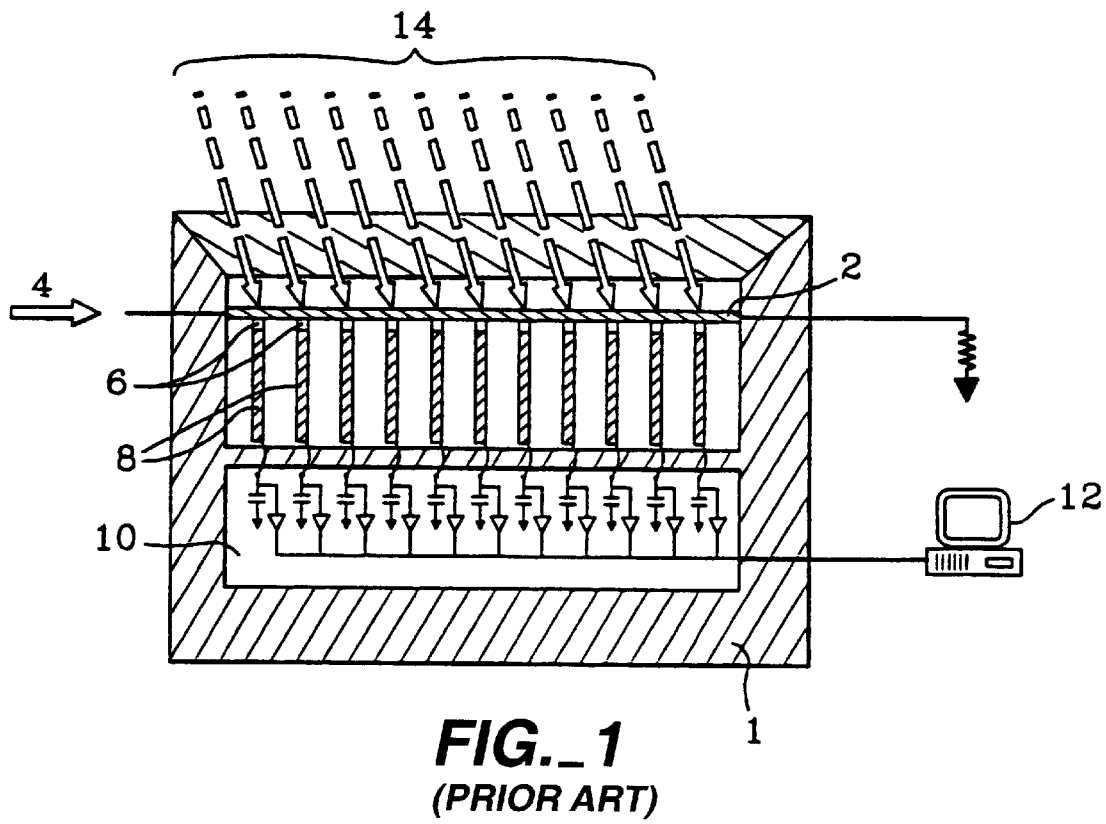
FIG._1
(PRIOR ART)
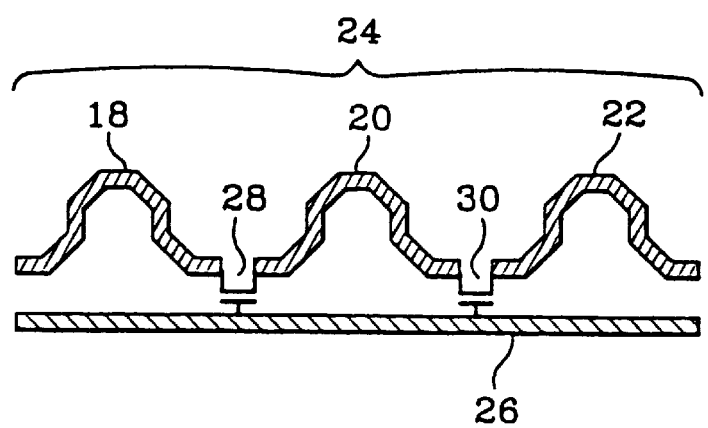
FIG._2

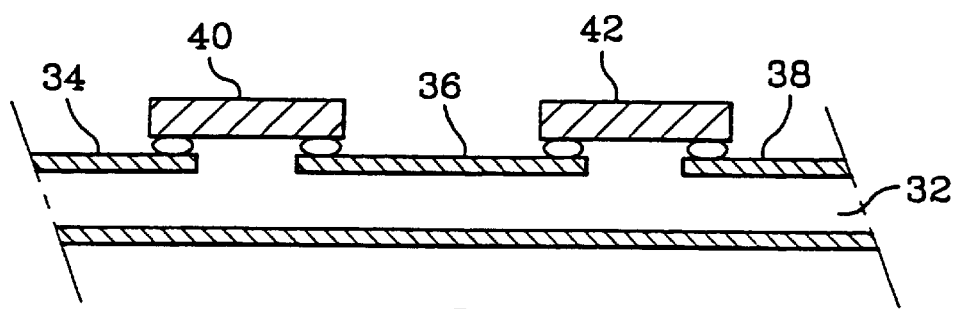
FIG._3
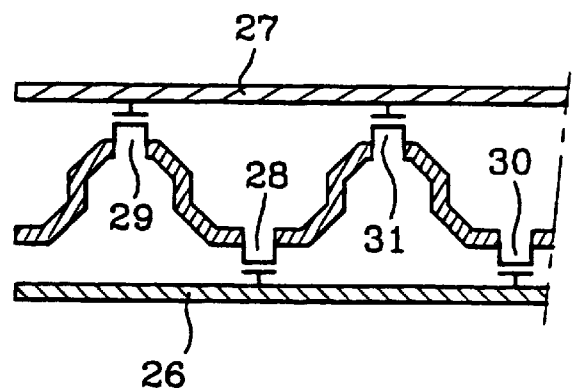
FIG._4
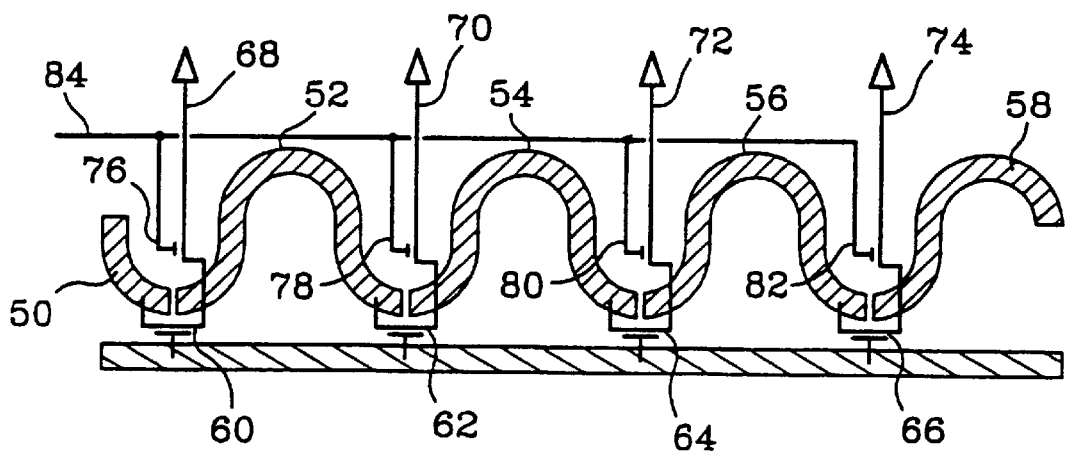
FIG._5

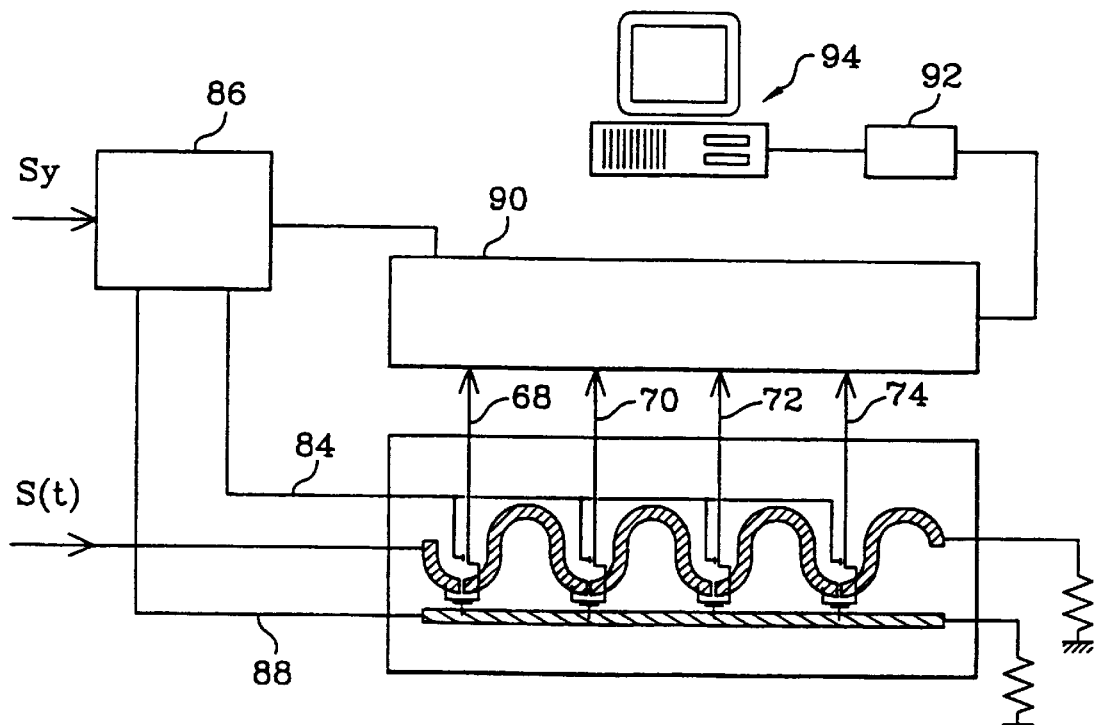
FIG._6
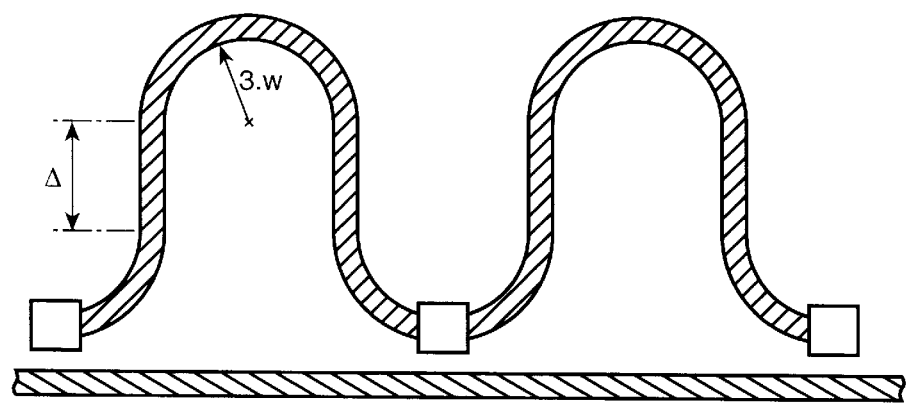
FIG._7

SWITCHED ELECTRICAL PULSE PROPAGATION SAMPLER

DESCRIPTION

1. Technological Field

The invention relates to the field of electrical samplers, particularly those for pulses having short or very short durations.

Pulse metrology permits the description of the temporal development of a signal or an electrical pulse, in particular of its voltage or of its energy, when this signal, or this pulse is unique (non-repetitive), and very short (that is to say it has a duration of the order of a few tens of picoseconds).

Such pulses to be measured generally arise from very fast radiation detectors, which convert into electrical pulses, the energy of a pulse of radiation which they receive, for example an X or gamma or visible or infra-red radiation pulse. Such radiation can be emitted by ultra-fast sources of radiation, such as lasers or sources of synchrotron radiation, or can be the result of a laser-material interaction caused by an ultra-fast laser (that is to say one whose pulse duration is in the picosecond or femtosecond range).

The invention can be applied to any measurement of a very brief and non-repetitive electrical signal, in particular in the physics of events or in the measurement of events, generated by picosecond phenomena.

2. State of the Technology

At the present time, there are sampling oscilloscopes on the market for measuring signals whose spectrum extends as far as 50 Ghz or 70 Ghz. These pieces of equipment permit the measurement of repetitive pulses. The sampling frequency is variable, from 250 kHz to 1 Ghz.

In order to measure single pulses, commercial pieces of equipment do exist on the market: they allow the reconstruction of a spectrum up to 5 Ghz or 7 Ghz.

Among laboratory prototypes, the device described in document U.S. Pat. No. 5,471,162 is known. Such a device relies on the principle of spatial sampling of a pulse. A pulse propagates itself along a propagation line. From this there results a spatial equivalence of the temporal evolution of this pulse which propagates itself along the line with a speed that depends on its physical characteristics. At a particular time t, if the line is of sufficient length, the totality of the pulse is divided up spatially along the line.

If the samplers are arranged along the propagation line, their simultaneous actuation allows a complete sampling of the pulse to be carried out, with a time step equal to the spatial step of the samplers, divided by the speed of propagation.

Also known is an optical sampling device which measures signals of bandwidth up to 35 Ghz. This device is illustrated in FIG. 1. It comprises a propagation line 2 into which is introduced and along which is propagated a pulse signal 4 to be measured. Sampling ports 6 made of a photo-conductor material (CdTe) are arranged in a regular manner along the line of propagation. These sampling ports are connected to sample taking lines 8, each of which is itself followed by charge reading means. All of the charge reading means are grouped together in a charge reading device 10. These charge reading means are connected to a computer 12 programmed to measure the relative charges on each channel and to analyse the pulse 4. Each sampling port 6 is closed using a triggering light pulse 14: there must be as many triggering light pulses as there are sampling ports. This device therefore requires a picosecond optical flash of a few tens of nanojoules to trigger the sampling.

These known samplers are therefore photo-conductors, in the case of the optical sampler (FIG. 1) and diodes in the case of the compact digitizer.

In these two known structures, samplers sample a part of the signal present at their level on the line. They are positioned in parallel on this propagation line.

These samplers have a limited bandwidth, linked to the bandwidth of the line itself. In addition, the sensitivity of detection (that is to say the quantity of charge sampled in the signal) is also limited. Finally, with regard to the optical sampler, the use of a high power picosecond laser imposes very great experimental financial constraints.

DESCRIPTION OF THE INVENTION

The invention provides a device that allows the problems above to be resolved. The invention employs spatial sampling of a pulse. It is adapted to the measurement of ultra-short electrical pulses, of very broad spectrum, and non-repetitive.

To put it more precisely, the object of the invention is an electrical sampler comprising;
   an electrical pulse propagation structure, comprising sections linked in pairs through switches,
   means of commanding the open and closed condition of the switches.

The sampler according to the invention therefore uses a propagation line made up of a series of line sections, linked to one another by a switch which can be commanded electrically.

The switches are usually on or closed. The taking of the "samples" can occur on opening these switches, which confines the totality of the charges carried by the pulse in the different sections that make up the line.

Hence an improvement in the sensitivity of the measurement is obtained, while all the charges carried by the pulse to be analysed are utilised.

The invention also relates to an electrical sampler comprising:
   an electrical pulse propagation structure, comprising sections isolated from one another and connected in pairs through switches, this propagation structure and that of the switches being produced on two different substrates,
   means of commanding the open and closed condition of the switches.

It is therefore possible to separate the manufacture of the propagation structure from that of the switch. One can, for example, produce the sections of the propagation structure, or the line sections using micro-strip technology, on a chosen material substrate of a chosen geometry, and then to use "flip-chip" switches, making use of micro-connection technologies. These switches are chosen and produced on a different support to the sections of propagation structure or line. This possibility opens up a wide choice of technological perspectives, both for the lines and for the switches and allows one to widen the spectrum of the pulses to be measured. The manufacture of the propagation structure and that of the switches on different substrates favours operation at very high frequencies.

The means of commanding the open and closed condition of the switches can comprise a second propagation structure, or propagation line, called a triggering structure or line, to which the switches are connected.

The signal triggering the opening of the switches can then be a voltage step propagating on the triggering structure, or the triggering line. The switches are connected to this triggering structure, or triggering line at desired intervals.

The sampling time step is then defined by the step difference between the signal propagating on the sections of the pulse propagation structure, and a signal propagating on the triggering structure or triggering line, between two successive switches.

Whichever embodiment is being considered, the electrical sampler according to the invention does not require a laser beam to trigger the measurement.

It is possible to produce means of commanding the open and closed condition of the switches that comprise a second and a third propagation structure, both of them called triggering structures, so as to optimise the sampling rate.

One may also employ N triggering structures, with N=3, 4, . . . etc.

According to another embodiment, one incorporates on the sections of the propagation structure, not only the switches that link the different sections, but also a small circuit made up of this switch, and a second switch, which permits the connection of a section to a sample taking line. The advantage is then that, before the opening of the switches, the sample taking lines are not connected to the propagation sections, and they do not hinder the propagation of the signal.

A substrate used to produce the propagation structure is preferably a substrate made of a material having:
- a crystalline nature that confers on it good hyperfrequency properties,
- a low loss tangent
- a relative electrical permittivity $\epsilon$ determined in relation to the desired analysis window and as a function of the chosen spatial sampling step.

Such a substrate favours high frequency signals (a few Ghz). $\epsilon$ determines the speed of propagation of the waves in the material.

The substrate is for example made of sapphire or of silica.

The material that will give good propagation properties at high frequency will not necessarily have properties that permit the creation of a switch.

The substrate used for the creation of the switches is preferably AsGa, which allows very short switching times to be provided.

BRIEF DESCRIPTION OF THE FIGURES

In any case, the characteristics and advantages of the invention will become more apparent in the light of the description that will follow. This description relies upon embodiment examples given for the purposes of explanation and which are non-limitative, and which make reference to the appended drawings in which:

FIG. 1 represents an optical sampler of the prior art,

FIG. 2 illustrates the principles of the electrical sampler with a section of line, according to the invention, FIG. 3 illustrates an embodiment of a sampler according to the invention, the switches being incorporated on a section of line, FIG. 4 illustrates an embodiment of the invention with two synchronisation lines FIG. 5 is an example of producing an electrical sampler according to the invention with means of taking samples of the amount of charge from each section, FIG. 6 represents a device comprising an electrical sampler according to the invention.

FIG. 7 represents another embodiment of a device comprising an electrical sampler according to the invention.

DETAILED DESCRIPTION OF EMBODIMENTS OF THE INVENTION

The principle of the electrical sampler with line sections is illustrated in FIG. 2.

A structure, or line, 24 for propagation of electrical pulses comprises a plurality of sections 18, 20, 22 of this structure. The different sections are connected in pairs through switches 28, 30, constituted for example, by MESFET AsGa (or Si, or MOS transistors or bipolar transistors on Si).

The means of commanding the switches 28, 30 comprises, for example, a second propagation structure 26 for triggering pulses, to which the switches 28, 30 are connected.

In FIG. 2, only three sections of the line 24 have been shown, but the line can comprise any number of sections, separated in pairs and connected in pairs through switches.

A signal to be sampled propagates along the propagation structure, or propagation line 24.

A synchronisation signal, for example, a voltage step slot propagates along the propagation line 26. The switches are usually on, or closed, and the voltage step opens these switches. This step or slot, therefore isolates each section of the propagation line, which is then used as a storage capacitance.

The totality of the charges transported by the pulse is then confined in the different sections 18, 20, 22 constituting the propagation structure of the pulse.

The structure illustrated in FIG. 2 therefore comprises:
- on the one hand, a first propagation structure 24 where the quantity of charge to be measured is propagated, and which is made up of sections linked in pairs through switches which are initially closed,
- on the other hand, a second propagation structure in which a "step" type synchronisation signal is propagated; at the moment the step passes, it modifies the command of the condition of the switch so that it opens, and isolates the two sections to which it is connected, the charges then being trapped in a section when the two switches which mark its boundaries are open. These are the charges which are then read by a suitable reading device.

The device is completed by synchronisation signal generating means, connected to the structure 26 for the propagation of synchronisation pulses. Furthermore, these means can be connected to a device for reading the charges in the sections.

In principle, the sectioning of a propagation line generates reflection phenomena at each end of the sections, which can reduce the bandwidth. In fact, in this invention, this phenomenon is prevented by adapting the gate widths of transistors and the dimensions of the input and output contacts, and by taking care over the connection between lines and contacts.

One particular embodiment is illustrated in FIG. 3. In FIG. 3, reference number 32 designates an insulating substrate onto which are deposited sections 34, 36, 38 of a line for propagation of electrical pulses. These sections are, for example, made up of sections of micro-strip line, for example of 50Ω impedance. Two switches 40, 42 provide the link between, on the one hand sections 34 and 36 and, on the other hand, sections 36 and 38. These switches are, for example, transistors, for example MESFET, and are incorporated into the line sections.

According to one embodiment example, the substrate 32 is a LaAlO$_3$ substrate of 170 μm thickness.

The sections of line have a width of 75 μm, a length of 1730 μm and have an impedance of 50Ω.

The triggering line has a width of 75 μm, an impedance of 50Ω, and is connected to the command of a switch in accordance with a 900 μm step.

The speed of propagation of the wave in these lines is $8.3 \times 10^6$ m/s, and the equivalent temporal sampling is carried out every 10 picoseconds. With a second synchronisation line, arranged in phase opposition in relation to the first, sampling is carried out every 5 picoseconds. An example of such an embodiment is given in FIG. 4, where two synchronisation lines 26, 27 are connected through switches 28, 29, 30, 31 to the propagation line.

Finally the storage capacitance of the information, constituted by one line section is 0.16 picofarad.

With regard to the switches, these are MESFET AsGa with a cut-off frequency of 30 Ghz, and an internal impedance of 50Ω. There are connected through indium microbeads onto the lines. Their input and output contacts are of the same width as the line (75 μm), which limits the reflections at the contacts.

FIG. 5 is an embodiment example and shows five sections 50, 52, 54, 56 58 connected to one another through switches 60, 62, 64, 66. On each section, reading the charges is carried out by means of a reading line 68, 70, 72, 74. This reading line is switched with the help of a switch 76, 78, 80, 82. A reading order is transmitted to these switches using a line 84.

Preferably, the switches 60–66 and the switches 76–82 for reading are on one and the same circuit. The reading of the charges is only carried out when a reading signal is sent on line 84.

The production of a sampler for ultra-short pulses, according to the invention, can be carried out from knowledge of the temporal analysis window, of the temporal sampling step, and the bandwidth which is given. As for these parameters, they are determined by the particular application being considered.

As a function of these data, a propagation structure is chosen suitable for the frequencies to be propagated, that is to say:
- the type of structure (micro-strip or others, for example a balance line (embedded strip)),
- the insulating substrate (the material making it up, its thickness, etc.),
- the geometry and the material of the conductive lines.

This choice is made in such a way that the signal is propagated on the lines, under the best conditions for conserving its energy and its frequency spectrum, taking into consideration its bandwidth.

The effective relative electrical permittivity corresponding to the available propagation structures can be calculated and from that the speed of propagation of the wave on these structures can be deduced.

If the synchronisation signal and the pulse to be measured are not propagated on the same type of structure (for example, if the substrates are different) two propagation speeds are obtained $V_{synchro}$ and $V_{pulse}$.

If $D_t$ is the chosen temporal sampling step, $D_{xs}$ the spatial step separating two switches on the synchronisation line and $D_{xi}$ the spatial step separating two switches on the pulse line, then one has:

$$D_t = (D_{xi}/V_{pulse}) - (D_{xs}/V_{synchro}).$$

The sampling window is produced with N intervals (N+1 switches), N being such that:

N=sampling window/temporal sampling step.

The total length of the sampling line is $N \times D_{xi}$ and the total length of the synchronisation line is $N \times D_{xs}$.

These lengths, and the choice of the intervals $D_x$ of the lines, are set taking into consideration the propagation of all the frequencies of the bandwidth on these lines.

FIG. 6 gives an example of an environment into which a structure according to the invention, for example of the type described above in FIG. 5, can be integrated.

A signal S(t) to be analysed is sent in the direction of the sampling line. Synchronisation pulses Sy command a system 86 for generating temporal sequencing signals. This system sends, through a line 88, triggering steps to the triggering line of the device. The charge reading pulses are sent, using a line 84, in the direction of the reading lines 68, 70, 72, 74. An acquisition and sequential reading system 90 permits the acquisition and the reading of the amounts of charge trapped in the sections of the sampling line. This system 90 is controlled by the system 86 for generating temporal sequencing signals. The data are then subjected to an analogue/digital conversion 92, and are then stored and/or processed by calculation means 94 (a computer).

The determination of the wave velocity depending on the propagation structure, can be made as following. In an homogeneous environment, the speed of propagation of an electromagnetic wave is given by the following formula:

$$V = (\epsilon_0, \epsilon_r)^{-\frac{1}{2}} C$$

In which C is the light velocity in vacuum, $\epsilon_0$ is the dielectric of vacuum, and $\epsilon_r$ is the relative permittivity of the environment.

In a non-homogeneous structure, the effective permittivity, related to the specific geometry of the structure and to the employed materials, has to be calculated. One gets: $v = \epsilon_{ar}^{-\frac{1}{2}} C$.

For a simple microstrip waveguide, an approximated evaluation is obtained by considering the $\epsilon_r$ of the substrate, its thickness, and the width of the line itself.

The calculations are explained, among other numerous publications, by R. Badoual, Ch. Martin, and S. Jacquet, in "Les Micro-ondes", vol. 1, p. 73–85, Editions Masson, collection Technologies.

Table I gives some examples of propagation velocities corresponding to different structures of 50 Ohms microstrip lines.

TABLE I

| Substrate | $\epsilon_r$ | Thickness (μm) | Line width (μm) | $\epsilon_{ar}$ | Propagation velocity |
|---|---|---|---|---|---|
| $Al_2O_3$ | 9.98 | 150 | 160 | 5.95 | 123 $10^6$ m/s (8.1 ps/mm) |
| $SiO_2$ | 3.8 | 100 | 225 | 2.67 | 183 $10^6$ m/s (5.4 ps/mm) |
| $LaAlO_3$ | 24.5 | 200 | 75 | 13.3 | 82 $10^6$ m/s (12.2 ps/mm) |

The determination of the lengths of the sections, depending on the time step to be achieved and the propagation line structure can be made as explained in the following example, to obtain a 100 Ghz sampling (i.e., 10 ps time step).

Let dxi be the length of a section of the line which propagates the impulse signal to be measured, and dxs the length of a section of the line which propagates the sync signal (synchronisation).

Both lines are of the same type and geometry, so the propagation speed is equal.

To achieve a sampling every 10 ps, it is necessary to fix (dxi−dxs)=v.10 ps.

If, for example, the propagation line is a meander, and the sync line is straight, we can calculate the length of section for both types of lines by geometric considerations. FIG. 7 is a scheme of such a structure, the switches being symbolized by squares, where the lengths dxi and dxs, w (line width) and the minimum bending radius 3w of the line, comply with dxs=4×3w and dxi=2×Pi×3ws2Δ.

The values of Δ are adapted to realise (dxi−dxs)=v.10 ps.

In table II, the results obtained for various line types are presented, considering that the minimum bending radius of a line is 3w (w is the line width).

The total lengths of both lines in case of a sampled window of 500 ps (50 sampling points) are also indicated. This is to get an idea of the signal degradation along the total line, and to estimate the dimensions of the device.

TABLE II

| Substrate | Thickness ($\mu$m) | Line width ($\mu$m) | dxi-dxs (mm) | dxs (mm) | dxi (mm) | 50 dxs (mm) | 50 dix (mm) |
|---|---|---|---|---|---|---|---|
| $Al_2O_3$ | 150 | 160 | 1.2 | 1.92 | 3.12 | 96 | 156 |
| $SiO_2$ | 100 | 225 | 1.8 | 2.7 | 4.5 | 135 | 255 |
| $LaAlO_3$ | 200 | 75 | 0.82 | 0.90 | 1.72 | 45 | 85 |

The invention can be applied to any measurement of a very brief and non-repetitive electrical signal. For example, it is suitable for the measurement of the temporal shape of the beam from synchrotron radiation. The Trieste (Italy) synchrotron radiation has a temporal spread of about a hundred picoseconds: in this case one can not use an optical sampler since the optical energy of the beam of electrons is only 1 picojoule. An electrical sampler according to the invention, with about thirty sampling points, allows a signal to be described over a duration of 300 picoseconds with a value every 10 picoseconds.

What is claimed is:

1. Electrical sampler comprising:
   an electrical pulse propagation structure comprising a series of sections isolated from one another and linked in pairs through switches,
   means of commanding the open and closed condition of the switches,
   the switches, connecting said sections in pairs, being usually closed so that the electrical pulse is propagated along the propagation structure, from one section to the next through the switch which connects the two sections.

2. Electrical sampler according to claim 1, the switches being produced on a substrate made of AsGa.

3. Sampler according to claim 1, the means of commanding the open and closed condition of the switches comprising a second propagation structure called a triggering structure, to which the switches are connected.

4. Sampler according to claim 3, comprising in addition, at least one supplementary propagation structure, called a second triggering structure, to which the switches are connected.

5. Sampler according to claim 1, comprising in addition means of taking samples of the amount of charge in each section.

6. Sampler according to claim 5, further comprising commutation means arranged between each section.

7. Sampler according to claim 1, the switches being of the MESFET type.

8. Sampler according to claim 1, the electrical pulse propagation structure being made up of sections of microstrip on an insulating substrate.

9. Sampler according to claim 8, the switches being incorporated on the micro-strips.

10. Electrical sampler according to claim 1, the propagation structure being produced on a substrate made of a material having:
    a crystalline nature that confers good hyperfrequency properties of the substrate,
    a low loss tangent
    a relative electrical permittivity determined as a function of a desired analysis window and as a function of a chosen temporal sampling step.

11. Electrical sampler according to claim 1, the propagation structure being created on a sapphire or silica substrate.

12. Electrical sampler comprising:
    an electrical pulse propagation structure comprising a series of sections isolated from one another and linked in pairs through switches, said propagation structure and said switches being produced on two different substrates,
    means of commanding the open and closed condition of the switches,
    the switches, connecting said sections in pairs, being usually closed so that the electrical pulse is propagated along the propagation structure, from one section to the next through the switch which connects the two sections.

13. Sampler according to claim 12, the means of commanding the open and closed condition of the switches comprising a second propagation structure called a triggering structure, to which the switches are connected.

14. Sampler according to claim 12, comprising in addition means of taking samples of the amount of charge in each section.

15. Sampler according to claim 12, the switches being of the MESFET type.

16. Sampler according to claim 12, the electrical pulse propagation structure being made up of sections of microstrip on an insulating substrate.

17. Electrical sampler according to claim 12, the propagation structure being produced on a substrate made of a material having:
    a crystalline nature that confers good hyperfrequency properties of the substrate,
    a low loss tangent
    a relative electrical permittivity determined as a function of a desired analysis window and as a function of a chosen temporal sampling step.

18. Electrical sampler according to claim 12, the propagation structure being created on a sapphire or silica substrate.

19. Electrical sampler according to claim 12, the switches being produced on a substrate made of AsGa.

* * * * *